(12) United States Patent
Tanaka et al.

(10) Patent No.: US 6,686,692 B1
(45) Date of Patent: Feb. 3, 2004

(54) ORGANIC ELECTROLUMINESCENT DEVICE WITH COLOR FILTER ENTIRELY COVERING FLAT ORGANIC ELECTROLUMINESCENT LAYER

(75) Inventors: Haruo Tanaka, Kyoto (JP); Mitsuru Morimoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/420,678

(22) Filed: Oct. 19, 1999

(30) Foreign Application Priority Data

Oct. 20, 1998 (JP) .......................... 10-298605
Oct. 18, 1999 (JP) .......................... 11-295930

(51) Int. Cl.$^7$ .......................... H05B 33/14; H05B 33/12
(52) U.S. Cl. .................. 313/504; 313/506; 313/503; 313/498; 445/24
(58) Field of Search ................. 313/504, 506, 313/505, 503, 500, 512, 498; 445/24

(56) References Cited

U.S. PATENT DOCUMENTS

| | | | | |
|---|---|---|---|---|
| 5,705,285 A | * | 1/1998 | Shi et al. | 428/690 |
| 5,811,177 A | * | 9/1998 | Shi et al. | 428/209 |
| 5,998,805 A | * | 12/1999 | Shi et al. | 257/40 |
| 6,008,578 A | * | 12/1999 | Chen | 313/506 |
| 6,037,712 A | * | 3/2000 | Codama et al. | 313/292 |
| 6,046,543 A | * | 4/2000 | Bulovic et al. | 313/504 |
| 6,117,529 A | * | 9/2000 | Leising et al. | 428/209 |
| 6,121,726 A | * | 9/2000 | Codama et al. | 313/504 |
| 6,198,217 B1 | * | 3/2001 | Suzuki et al. | 313/504 |
| 6,433,355 B1 | * | 8/2002 | Riess et al. | 257/40 |

FOREIGN PATENT DOCUMENTS

EP                961330 A    * 12/1999

* cited by examiner

Primary Examiner—Ashok Patel
Assistant Examiner—Sikha Roy
(74) Attorney, Agent, or Firm—Merchant & Gould P.C.

(57) ABSTRACT

A cathode electrode, an organic EL layer, an anode electrode, and a color filter are formed in this order on a glass substrate. Light from the organic EL layer is emitted from the side of the anode electrode, through the color filter. The color filter is formed after forming the anode electrode, the organic EL layer, and the cathode electrode, so that it does not have to be made of a material that can withstand the conditions (e.g. temperature) for forming the anode electrode, the organic EL layer, and the cathode electrode. Since it is not necessary to provide the organic EL layer on top of the color filter with its large level differences, variations in the film thickness of the organic EL layer are eliminated, and light emission irregularities can be prevented.

5 Claims, 13 Drawing Sheets

<PRIOR ART>

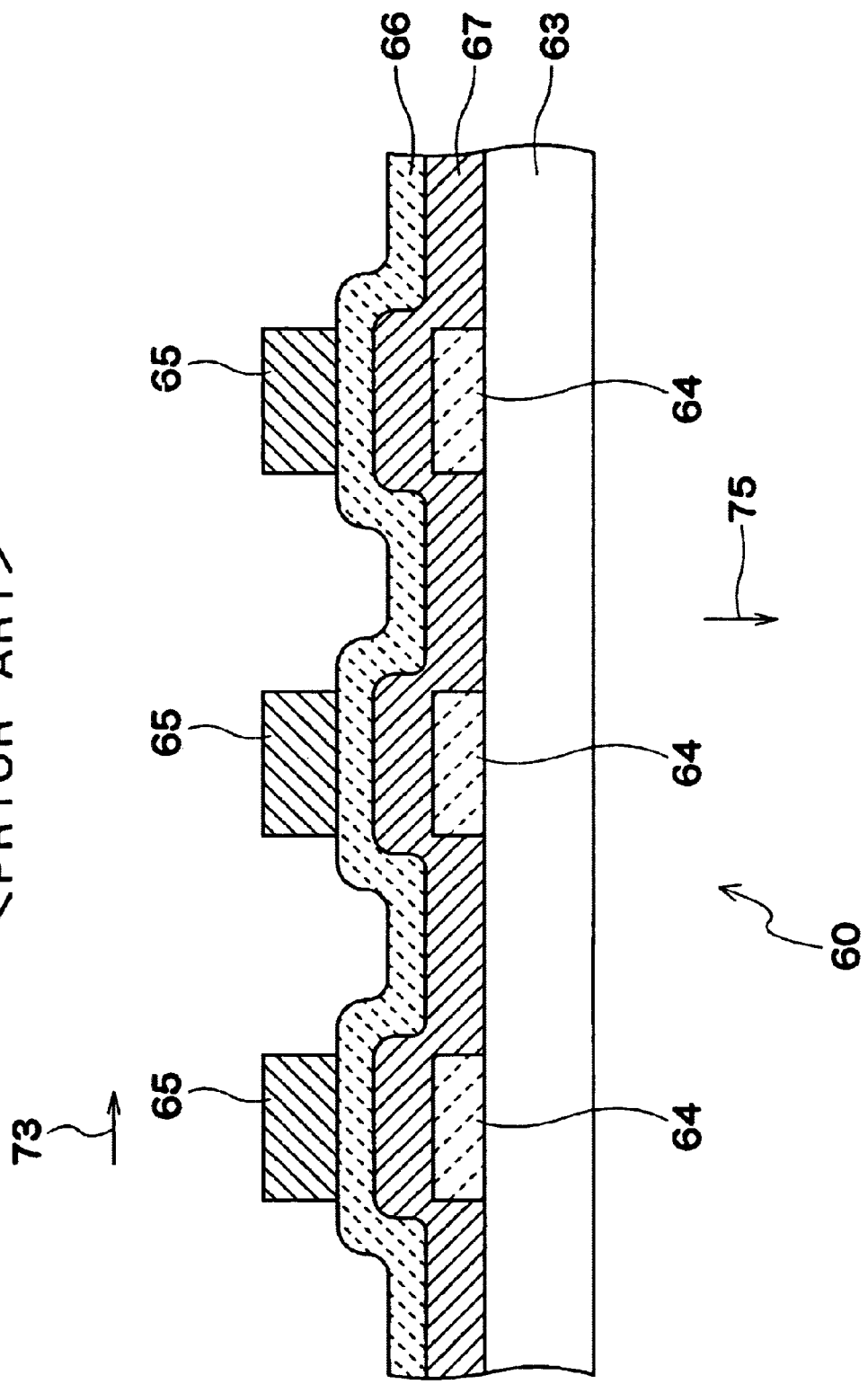
FIG.2 <PRIOR ART>

ORGANIC ELECTROLUMINESCENT DEVICE WITH COLOR FILTER ENTIRELY COVERING FLAT ORGANIC ELECTROLUMINESCENT LAYER

BACKGROUND OF THE INVENTION

1. Field of the Invention

The present invention relates to an electroluminescent device [also referred to as "EL device" in the following], and in particular to an electroluminescent device with a flattened electroluminescent layer [also referred to as "EL layer" in the following].

2. Description of the Prior Art

FIG. 1 shows the basic structure of an organic EL device with a color filter. The organic EL device 50 includes a color filter 59, an anode electrode 57 made of ITO, an organic EL layer 56, and a cathode electrode 55, formed in this order on a glass substrate 53 serving as a supporting member. The organic EL layer 56 consists of a hole transport layer 56a and an emitter layer 56b. When a predetermined voltage is applied between the anode electrode 57 and the cathode electrode 55, the emitter layer 56b emits light, which is emitted through the color filter 59 and the glass substrate 53.

FIG. 2 shows a color organic EL device 60, whose anode electrodes and cathode electrodes are arranged in form of a matrix. The organic EL device 60 includes a plurality of color filters 64 extending in the row direction and lined up in the column direction 73, formed on a glass substrate 63 serving as the supporting member. A plurality of anode electrodes 67 made of ITO extending in the column direction and lined up in the row direction are formed on the color filters 64. An organic EL layer 66 extending over the entire substrate is formed on top of the anode electrodes 67. A plurality of cathode electrodes 65 extending in the row direction and lined up in the column direction are formed on top of the organic EL layer 66.

Selecting the anode electrodes 67 and cathode electrodes 65 to which a voltage is applied, the organic EL layer 66 emits light at the desired locations, which is transmitted through the color filter 64 and the glass substrate 63, and emitted in the arrow direction 75.

This organic EL device 60, however, has the following problems. In this organic EL device 60, the anode electrodes 67, the organic EL layer 66, and the cathode electrodes 65 are formed after forming the color filter 64, because the color filter 64, the anode electrodes 67, the organic EL layer 66, and the cathode electrodes 65 are formed in this order on the glass substrate 63. Consequently, the anode electrodes 67, the organic EL layer 66, and the cathode electrodes 65 have to be formed under conditions that do not destroy the color filter 64, which has already been formed. The forming conditions (such as material quality and temperatures) for those electrodes and for the organic EL layer 66 are limited to conditions that the color filter 64 can withstand. Also, because the anode electrodes 67, the organic EL layer 66, and the cathode electrodes 65 are formed on the color filter 64, the surface of the color filter 64 has to be smooth.

Moreover, the organic EL layer 66 is about 100 nm thick, whereas the thickness of the color filter 64 is about 1 to 3 $\mu$m. When such a thin organic EL layer is formed on top of the color filter 64 with its sharp differences in level, there is the danger that the organic EL layer becomes thinner at corner portions of the level differences. Electric fields concentrate at the thin portions of the organic EL layer, which leads to light emission irregularities. The amount of light emitted from the organic EL layer is inversely proportional to the third power of its film thickness, so that slight variations of the film thickness have a large influence on the amount of emitted light.

SUMMARY OF THE INVENTION

With the foregoing drawbacks of the prior art in view, it is an object of the present invention to present an EL device with color filter, allowing the EL layer to be made flat.

An organic EL device of the present invention includes 1) a lower electrode formed in or on a substrate with a flat surface, 2) an organic EL layer formed on top of the lower electrode, 3) a transparent upper electrode formed on top of the organic EL layer, and 4) a color-converting layer arranged on top of the upper electrode.

The features of the present invention, other objects, uses and merits should become clearer from the following examples, with reference to the accompanying drawings.

BRIEF DESCRIPTION OF THE DRAWINGS

FIG. 2 is a cross-sectional view showing the basic structure of a conventional organic EL device with a color filter;

DESCRIPTION OF THE PREFERRED EMBODIMENTS

1-1. First Embodiment

The following is an explanation of an embodiment of the present invention, with reference to the accompanying drawings.

Figure 1:
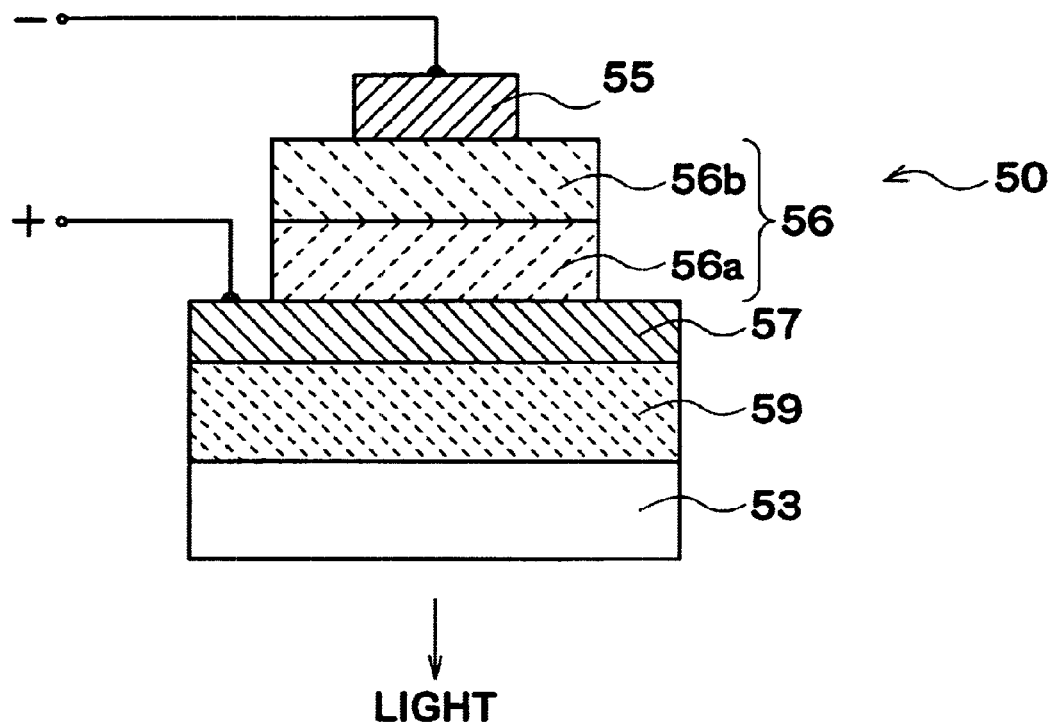
FIG. 1 is a cross-sectional view showing the basic structure of a conventional organic EL device.
Figure 3A:
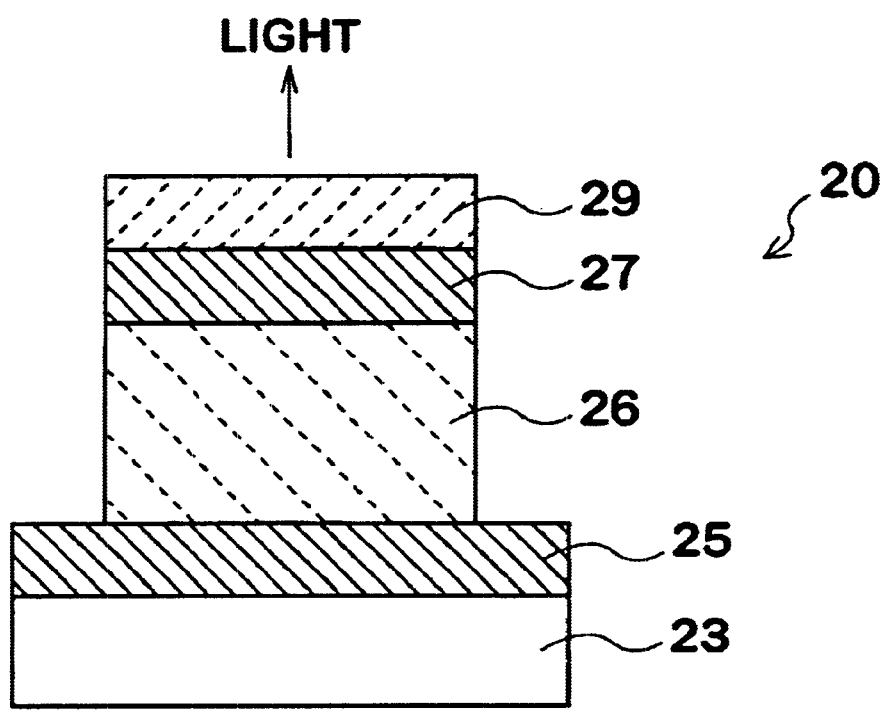
FIG. 3a is a cross-sectional view showing the basic structure of an organic EL device of the first embodiment.

As shown in FIG. 3a, an organic EL device 20 includes a metal cathode electrode 25 formed on a glass substrate 23. An organic EL layer 26 is formed on top of the cathode electrode 25. The organic EL layer 26 includes an emitter layer and a hole transport layer disposed on the emitter layer (both layers not shown in the drawing). A transparent anode electrode 27 is formed on top of the organic EL layer 26. A color filter 29 serving as a color-converting layer is formed on top of the anode electrode 27. Thus, by arranging the color filter 29 on the opposite side of the glass substrate serving as the supporting member, the smoothness of the filter surface is hardly an issue. Also, since the color filter 29 can be formed after forming the anode electrode 27, the organic EL layer 26, and the cathode electrode 25, there are no limitations with regard to the conditions for forming the anode electrode 27, the organic EL layer 26 and the cathode electrode 25 or the material quality of the color filter 29. Consequently, the color filter 29 can be formed after forming the anode electrode 27, by printing or any other method. Furthermore, the problem of light emission irregularities caused by inhomogeneous film thicknesses can be avoided.

Moreover, the color filter 29 is formed on the anode electrode 27. Therefore, it also functions to prevent the intrusion of water into the organic EL layer 26.

It is also possible to provide a transparent dielectric layer between the color filter 29 and the anode electrode 27. Such a dielectric layer can prevent chemical components of the color filter 29 from intruding into the organic EL layer.

Also, light exits the organic EL device 20 from the anode electrode side, which is on the side opposite of the glass substrate 23. Consequently, there is no problem of the glass substrate 23 absorbing the light.

Figure 3B:
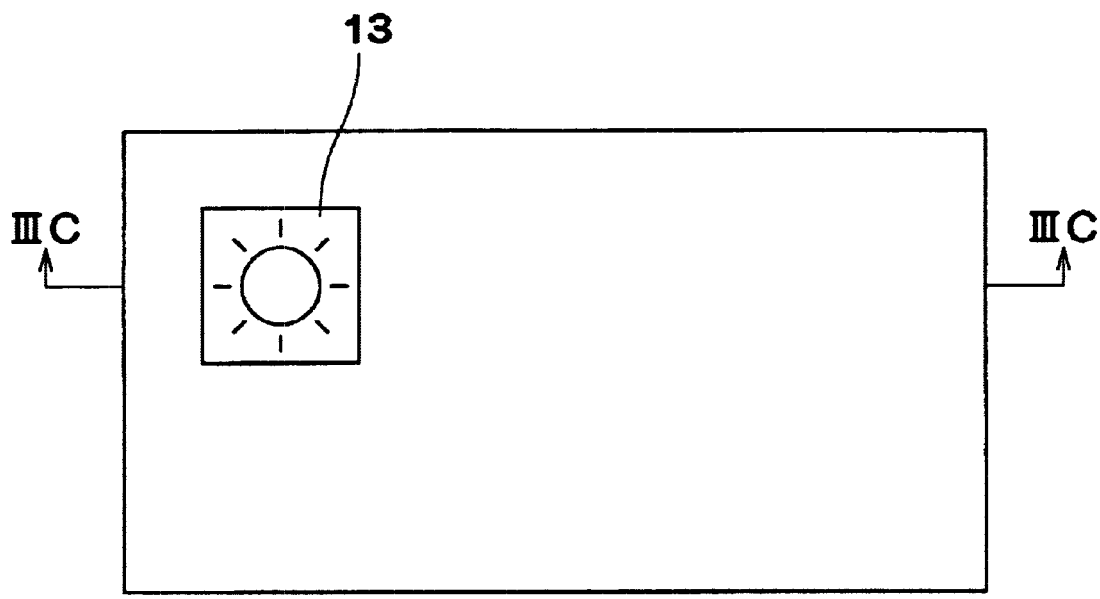
FIG. 3b is a top view of an application example of the first embodiment.
Figure 3C:
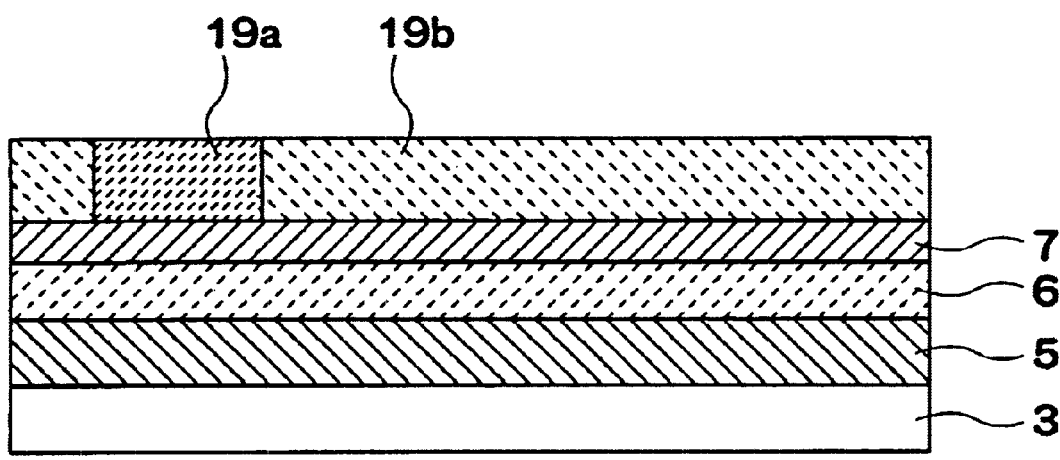
FIG. 3c is a cross-sectional drawing taken along IIIc—IIIc in FIG. 3b.

FIGS. 3b and 3c show an application example of the present embodiment. FIG. 3c is a cross-sectional view of FIG. 3b along IIIc—IIIc. In this example, filter 19a is a filter for green, whereas filter 19b is black and blocks light completely. Therefore, when the organic EL layer 6 emits light, only the portion of region 13, which is covered by the filter 19a, lights up.

1-2. Second Embodiment

Figure 4:
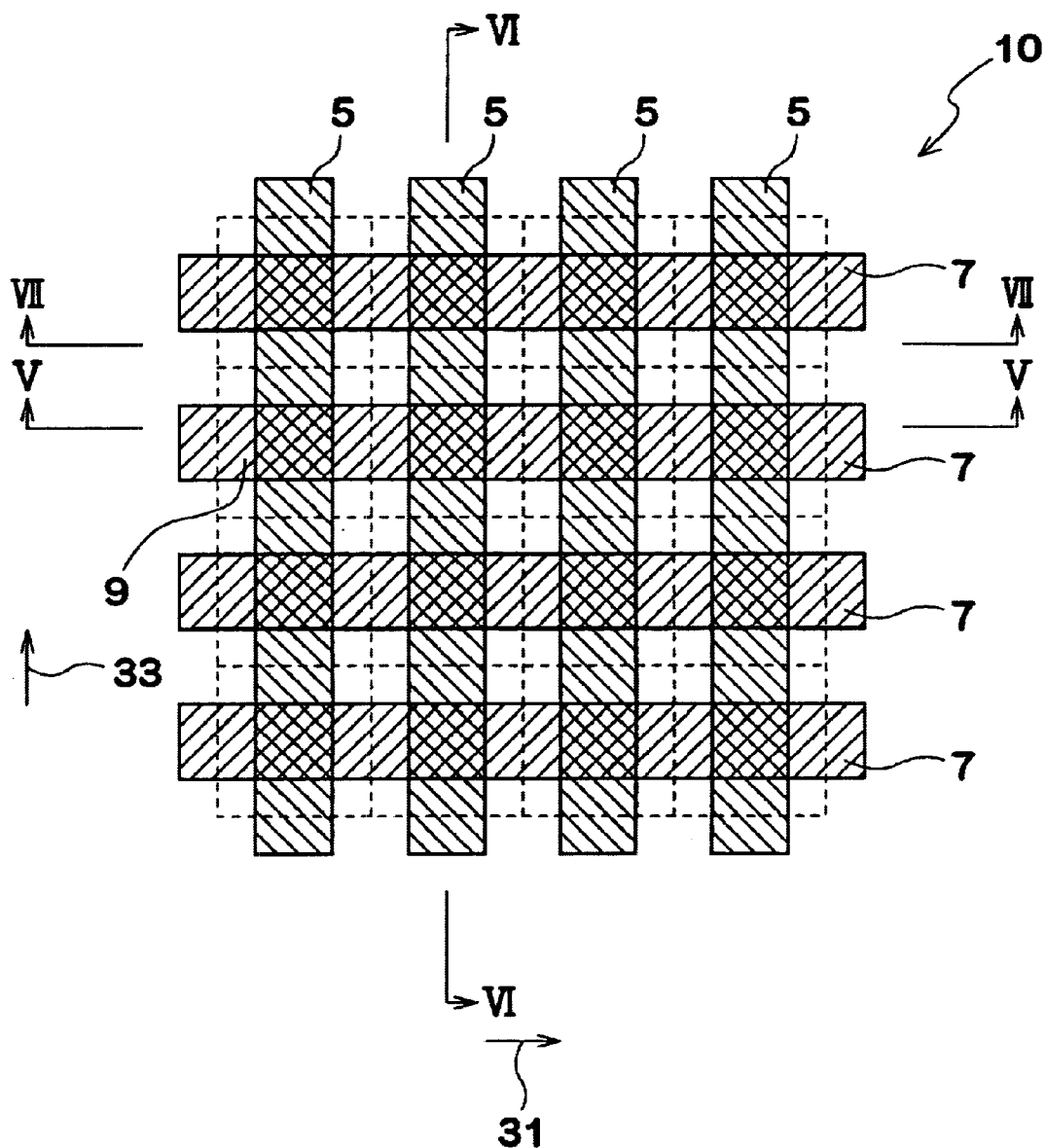
FIG. 4 shows the electrode arrangement for the organic EL device of the second embodiment.

FIG. 4 is a top view of an organic EL device 10, in which the upper and lower electrodes (i.e. the anode electrodes 7 and the cathode electrodes 5) are arranged as a matrix.

Figure 5:
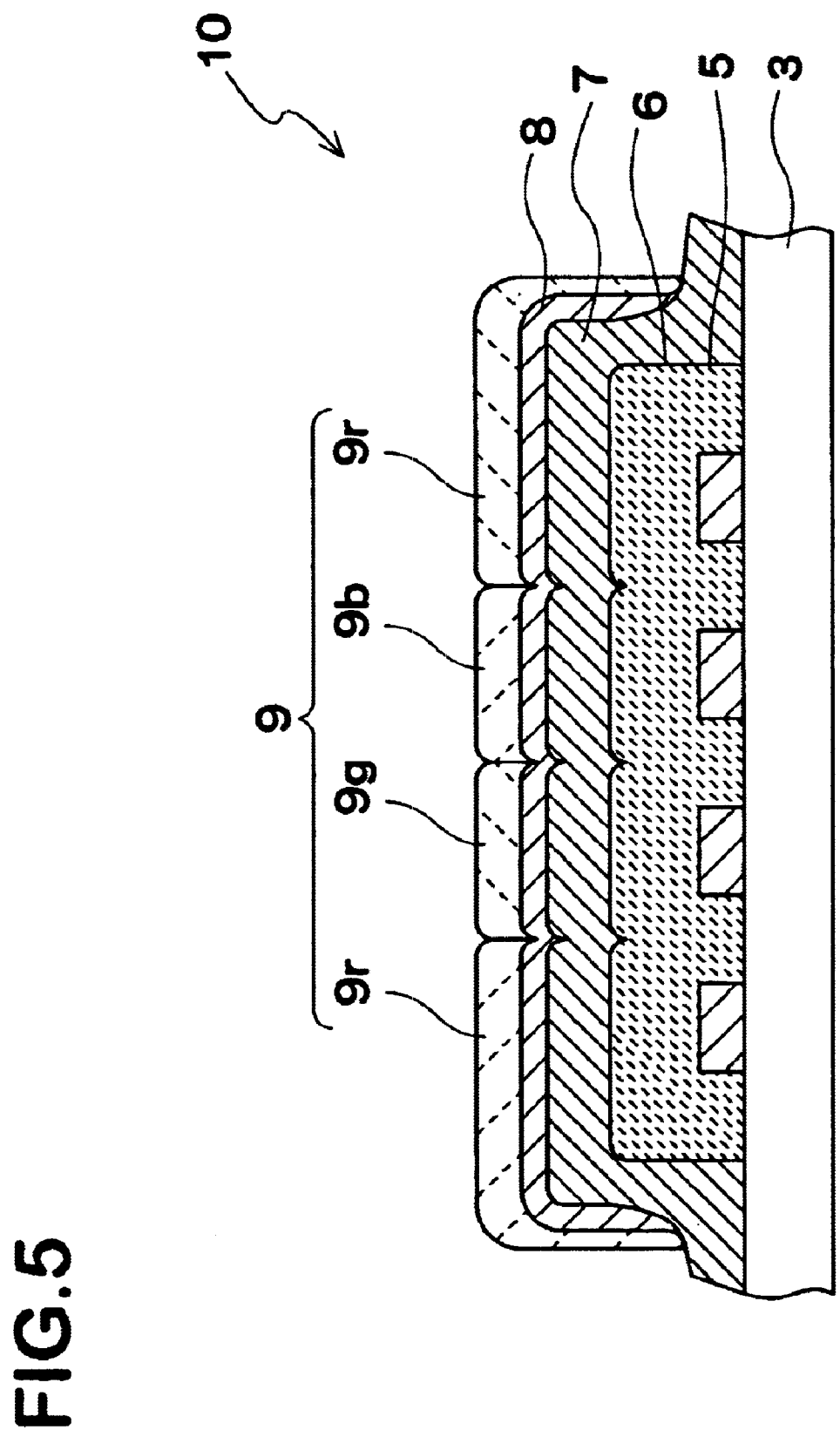
FIG. 5 shows the basic structure of the organic EL device of the second embodiment.
Figure 6:
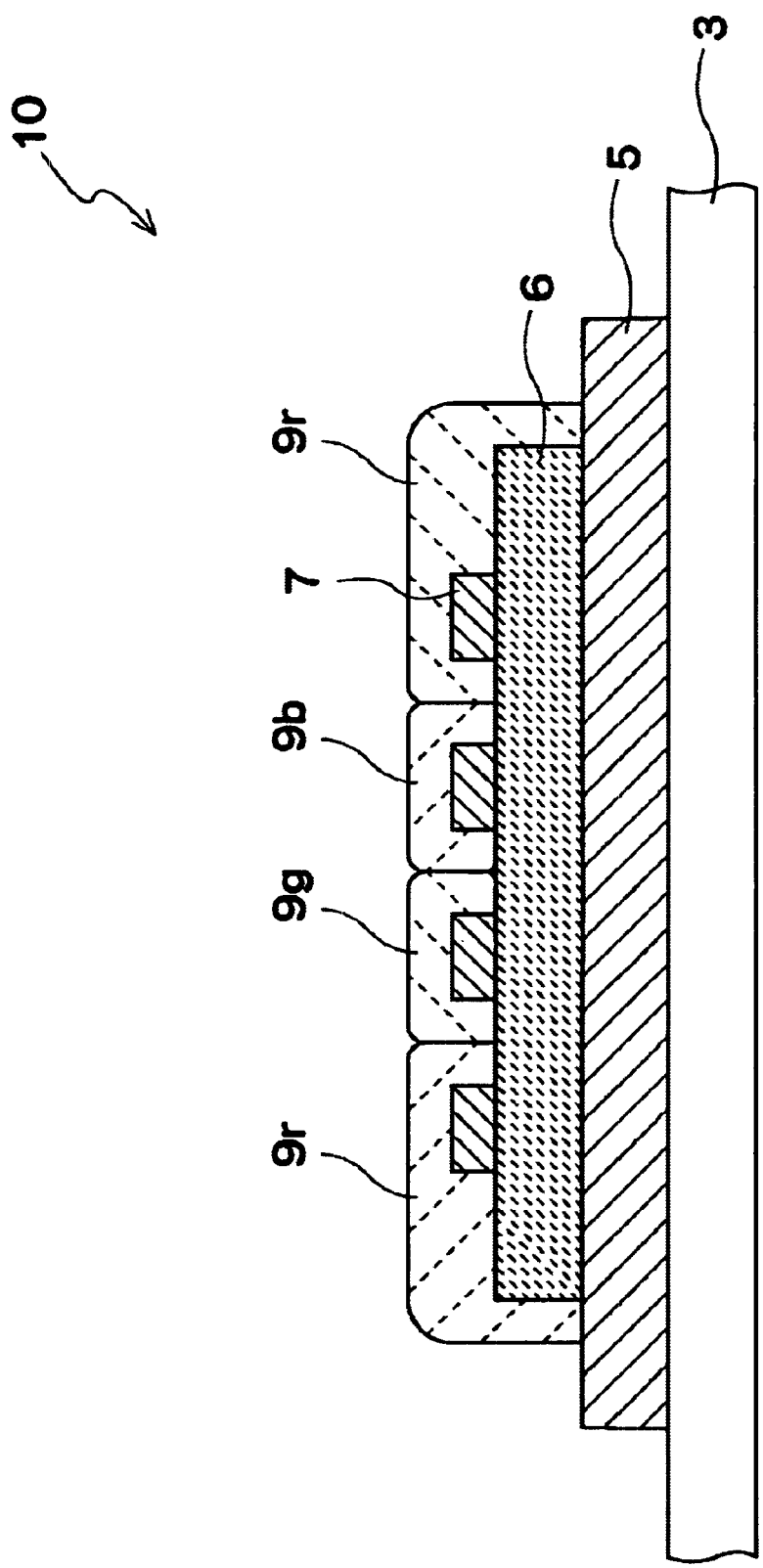
FIG. 6 shows the basic structure of the organic EL device of the second embodiment.
Figure 7:
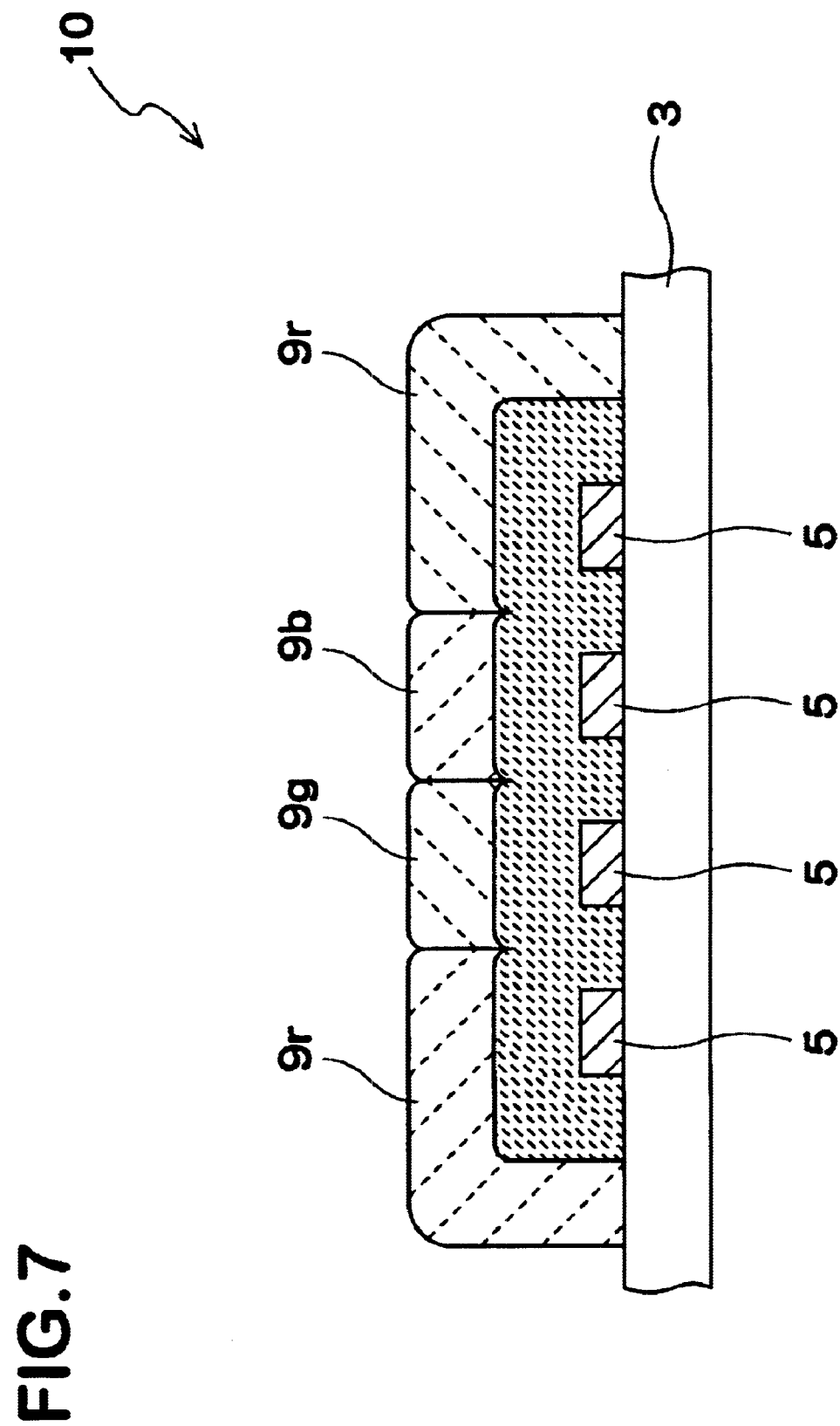
FIG. 7 shows the basic structure of the organic EL device of the second embodiment.

In this organic EL device 10, the cathode electrodes 5 are arranged on a glass substrate (not shown in the drawing). The cathode electrodes 5 extend in the row direction (arrow direction 33), and are lined up in the column direction (arrow direction 31), forming a cathode electrode group. The organic EL layer 6 is arranged on top of the cathode electrodes 5, as shown in FIGS. 5 and 6. The organic EL layer 6 includes a emitter layer and a hole transport layer disposed on top of the emitter layer (both layers are not shown in the drawing). FIG. 5 is a cross-sectional view taken along V—V in FIG. 4. FIG. 6 is a cross-sectional view taken along VI—VI in FIG. 4. FIG. 7 is a cross-sectional view taken along VII—VII in FIG. 4.

Anode electrodes 7 are arranged on top of the organic EL layer 6, as shown in FIGS. 5 and 6. As shown in FIG. 2, the anode electrodes 7 extend in the column direction (arrow direction 31), and are lined up in the row direction (arrow direction 33), forming an anode electrode group.

A color filter 9 is disposed on top of the anode electrodes 7, as shown in FIGS. 5 and 6. As shown in FIG. 4, the color filter 9 is arranged to form a grid with a suitable pattern for R, G, and B, with their overlapping portions at the center having the overlapping portions of the cathode electrodes 5 and the anode electrodes 7 at the center. As shown in FIGS. 5, 6, and 7, the color filter 9 also covers the side surfaces of the organic EL layer 6. Therefore, the organic EL layer 6 can be protected from water intruding from the outside without providing a separate water protection film.

Since the cathode electrodes 5 and the anode electrodes 7 need lead portions, they extend all the way to the outer side of the color filter 9, as shown in FIGS. 5 and 6.

The following is an explanation of the steps for manufacturing the organic EL device 10. The cathode electrodes 5 are formed on a glass substrate 3. In the present embodiment, the cathode electrodes 5 are formed by vacuum deposition with resistance wire heating of a 200 nm Mg—Ag alloy thin film under the film forming conditions of not more than $1 \times 10^{-9}$ Torr ultimate pressure before film formation and the substrate temperature being at room temperature. But it is also possible to use other materials and to insert a metal with a small work function based on LiF or C between aluminum electrodes.

Then, the organic EL layer 6 is formed on the entire surface. In this embodiment, a emitter layer of an organic chemical compound is formed by vacuum deposition with resistance wire heating of a 50 nm thin film of a triphenylamine derivative and a tris (8-hydroxyquinoline) aluminum complex under the film forming conditions of $1 \times 10^{-5}$ to $1 \times 10^{-7}$ Torr ultimate pressure before film formation and the substrate temperature being at room temperature.

For the emitter layer, it is possible to use anthracene derivatives, pyrene derivatives, tetracene derivatives, stilbene derivatives, perylene derivatives, quinone derivatives, phenanthrene derivatives, naphthacene derivatives, naphthalimide derivatives, phthaloperynone derivatives, cyclopentadiene derivatives, cyanine derivatives, or any other organic material displaying significant fluorescence in the visible wavelength region.

It should be noted that in this specification, the organic EL layer is made of two layers, namely a triphenylamine derivative layer and a tris (8-hydroxyquinoline) aluminum complex thin film, but to simplify explanations, they are noted as one layer in the drawings. Moreover, the configuration of the organic EL layer can be chosen as appropriate, and it is also possible to provide a light emission supplementary layer (such as an electron transport layer), and to use a multiple layer configuration of three, four, or five layers.

Then, the anode electrodes 7 are formed. In the present embodiment, the anode electrodes 7 are formed by high frequency sputtering an ITO thin film of 150 nm film thickness using an ITO ceramic target and Ar as the sputter gas. Instead of ITO, the anode electrodes can also be formed of conductive material having a work function of not less than 4.5 eV, such as $In_2O_3$ or gold. It is also possible to form the anode electrodes by EB (electron beam) deposition.

Next, the color filter 9 is formed. In the present embodiment, the color filter was formed by screen printing at 3 μm thickness the colors R, G and B in a patchwork manner. The color filter 9 can also be formed by spin-coating the entire surface, followed by elimination of unnecessary portions with a resist, as in the prior art. Moreover, the color filter 9 should be formed so as to cover the side surfaces at the edges of the organic EL layer 6.

In the present embodiment, the cathode electrodes 5, which are metal electrodes, can be formed by etching without using a shadow mask, because the cathode electrodes 5 are formed before the organic EL layer 6.

It is also possible to form an reflective film between the glass substrate and the cathode electrodes, in order to improve the reflection efficiency.

It is further possible to provide a transparent intrusion-preventing layer 8 between the color filter 9 and the anode electrodes 7, in order to prevent chemical compounds that are part of the color filter to enter the organic EL layer. For such an intrusion-preventing layer 8, it is possible to use, for example, a silicon oxide film of 150 nm film thickness.

1-3. Third Embodiment

Figure 8:
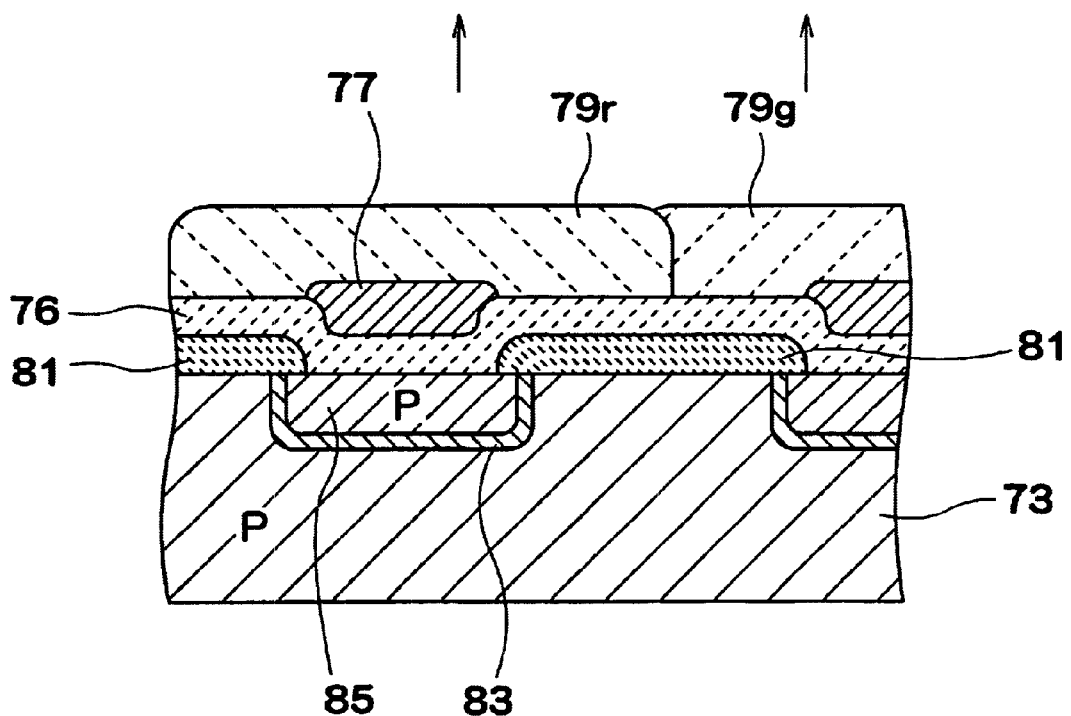
FIG. 8 shows the basic structure of the organic EL device of the third embodiment.

FIG. 8 shows an organic EL device 70 of the third embodiment. This organic EL device 70 is an active matrix-type light emitting device. That is to say, it includes an active device for each pixel, turning the pixel on and off. In this embodiment, photo-transistors are used for these active devices.

In the organic EL device 70, an n-type impurity region 83 is formed in the silicon substrate 73, and a p-type impurity region 85 is formed in the n-type impurity region 83. The silicon substrate 73, the n-type impurity region 83, and the p-type impurity region 85 correspond to a collector region, a base region and a emitter region, respectively.

In this embodiment, the p-type impurity region 85 corresponds to the lower electrode. A silicon oxide film 81 is formed selectively on the silicon substrate 73, and an organic EL layer 76 is formed on top of the silicon oxide film 81. The organic EL layer 76 contacts the p-type impurity region 85. Anode electrodes 77 are formed on top of the organic EL layer 76, above the p-type impurity region 85.

In this embodiment, a photo-transistor is formed in the silicon substrate 73. The emitter region of the photo-transistor functions as the lower electrodes of the organic EL layer 76. Consequently, once the photo-transistor is turned on with light by applying a predetermined base voltage to the photo-transistor, the organic EL layer 76 above it emits light, which is emitted through the filter 79. Moreover, light emitted by the organic EL layer 76 also enters the photo-transistor. Consequently, once the photo-transistor is turned on, it holds itself in this state. Thus, the present invention can be applied to devices where the lower electrodes are formed in the substrate, just as it can be applied to devices where the lower electrodes are formed on the substrate.

Now, this embodiment has been explained for the case that the organic EL layer is formed directly on a substrate with a smooth surface, but if a deposition layer has been formed on the substrate and the surface is not smooth, it is still possible to form the organic EL layer after making the surface smooth by CMP (chemical mechanical polishing).

This example has been explained for the case that the lower electrode is formed with an impurity layer region, but it is also possible to form the upper electrode with an impurity layer region.

It is further possible to use an npn-transistor instead of a pnp-transistor for the photo-transistor.

2-1. Other Embodiments

Figure 9:
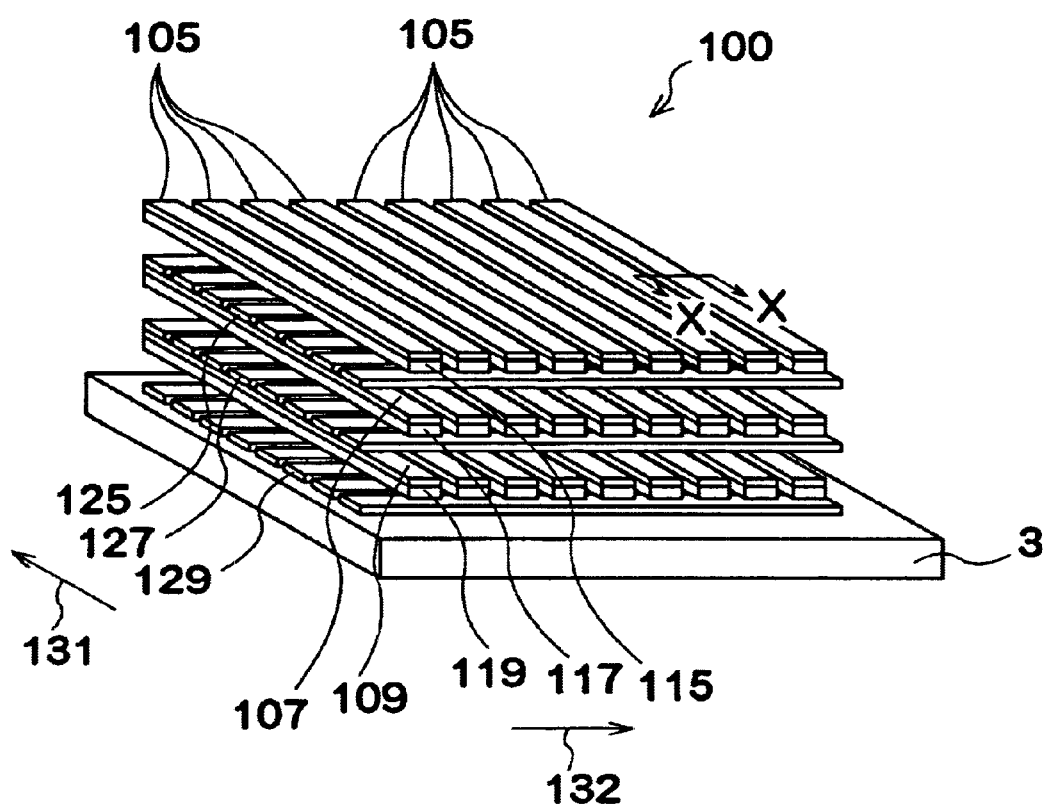
FIG. 9 is a perspective view of an EL panel portion.
Figure 10:
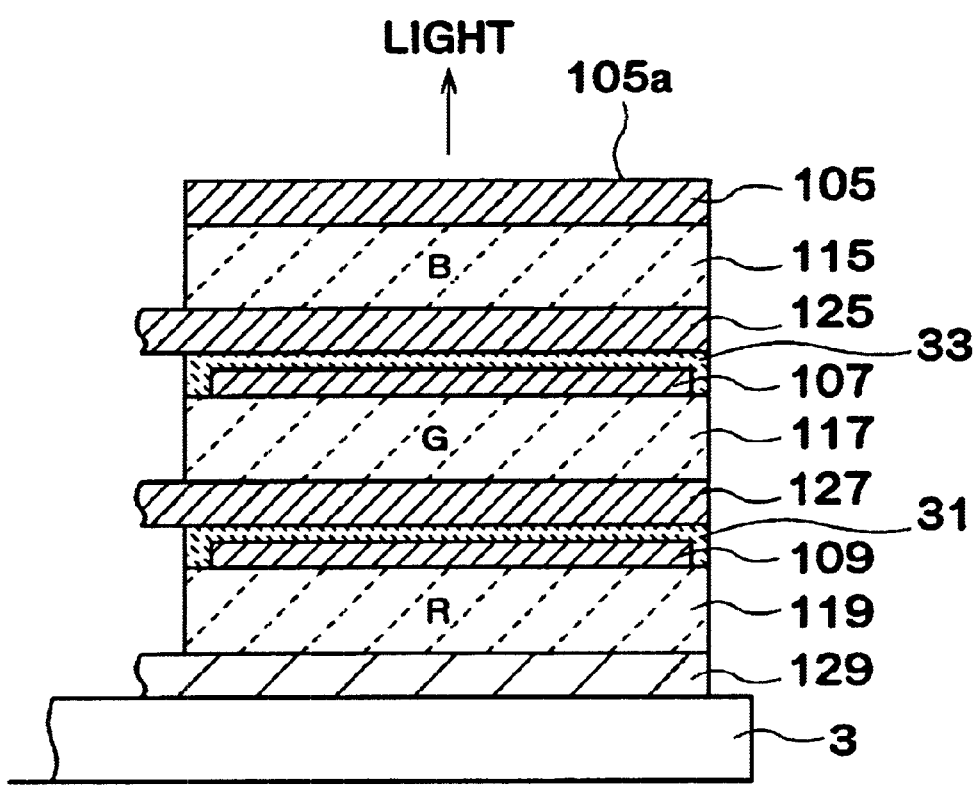
FIG. 10 is a cross-sectional view taken along X—X in FIG. 9.

FIG. 9 is a perspective view of a full color display EL panel portion 100, without using a color filter. This EL panel portion 100 is a full color display, made by disposing RGB EL devices. In this EL panel portion 100, cathode electrodes 129 serving as strip-shaped metal electrodes are lined up, side by side, in the direction of arrow 131 in FIG. 9. On top of the cathode electrodes 129, red emitter layers 119 are lined up, side by side, in the direction of arrow 132 in FIG. 9. On top of the red emitter layers 119, strip-shaped anode electrodes 109 are lined up, side by side, in the direction of arrow 131 in FIG. 9. As shown in FIG. 10, the anode electrodes 109 are covered by a silicon oxide film 31. The anode electrodes 109 and the cathode electrodes 129 are the electrodes for emitting red light. In this embodiment, the anode electrodes 109, the red emitter layers 119, and the cathode electrodes 129 make up a red light emitting portion. The cathode electrodes 129 are made of metal electrodes.

There are also green light emitting portions disposed on top of the silicon oxide film 31. That is, strip-shaped cathode electrodes 127 are lined up, side by side, in the direction of arrow 131. On top of the cathode electrodes 127, green emitter layers 117 are lined up, side by side, in the direction of arrow 132. On top of the green emitter layers 117, strip-shaped anode electrodes 107 are lined up, side by side, in the direction of arrow 131. As shown in FIG. 9, the anode electrodes 107 are covered by a silicon oxide film 33.

There are also blue light emitting portions disposed on top of the silicon oxide film 33. That is, strip-shaped cathode electrodes 125 are lined up, side by side, in the direction of arrow 131. On top of the cathode electrodes 125, blue emitter layers 115 are lined up, side by side, in the direction of arrow 132. On top of the blue emitter layers 115, strip-shaped anode electrodes 105 are lined up, side by side, in the direction of arrow 131.

Thus, with this arrangement, light can be emitted from the opposite site of the glass substrate 3. Also, using metal for the cathode electrodes that are the furthest away from the light emitting surface 105a, light is reflected, which enhances the brilliance.

In this embodiment, emitter layers for R, G, and B are formed so as to make a stacked structure. Therefore, the width of the strip-shaped organic EL layers can be enlarged. This makes it possible to provide an EL panel portion with high brilliance. Moreover, the organic EL layers are formed in the order B, G, and R, starting from the light emitting surface 105a through which the light is emitted. Consequently, light with short wavelengths is not absorbed by emitter layers emitting at a long wavelength.

Thus, in this embodiment, red light emitting portions 119, green light emitting portions 117, and blue light emitting portions 115 are formed successively in this order on a glass substrate 3. The electrodes for these light emitting portions are transparent electrodes. Silicon oxide films 31 and 33 are arranged between the emitter layers. Consequently, light is emitted from the light emitting surface 105a, without light of short wavelengths being absorbed by the emitter layer emitting at a long wavelength. Furthermore, using metal electrodes for the cathode electrodes 129 that are the furthest away from the light emitting surface 105a, light is reflected, which enhances the brilliance. Consequently, the display panel achieves a sufficient brilliance at lower current densities.

Figure 11:
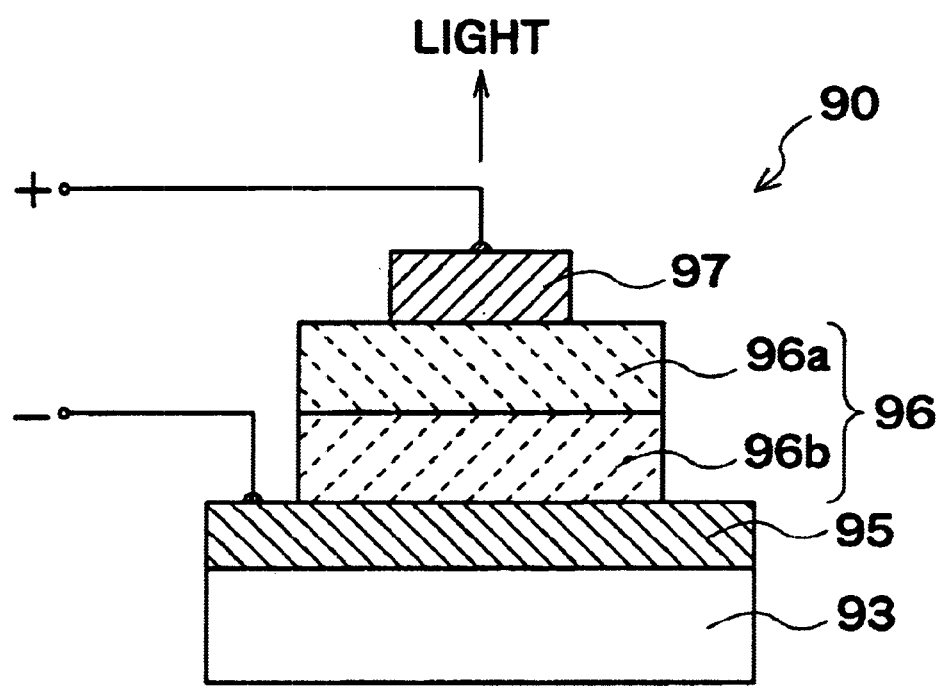
FIG. 11 is a cross-sectional view showing the basic structure of an organic EL device without filter.

FIG. 11 is a cross-sectional drawing of the principal aspects of an organic EL device 90 without a color filter. In this organic EL device 90, a metallic cathode electrode 95, an organic EL layer 96, and a transparent anode electrode 97 are formed in this order on a glass substrate 93. The organic EL layer 96 includes a emitter layer 96b and a hole transport layer 96a arranged on top of the emitter layer 96b.

This embodiment has been explained for an organic EL device, but it can be similarly applied to an inorganic EL device.

The present invention can be applied, not only to devices where a color filter is formed below the organic EL layer, but also to devices where any other layer with large level differences has to be formed below the organic EL layer, by similarly forming this other layer on top of the upper electrodes.

An organic EL device in accordance with the present invention includes 1) a lower electrode formed in or on a substrate with a flat surface, 2) an organic EL layer formed on top of the lower electrode, 3) a transparent upper electrode formed on top of the organic EL layer, 4) a color-converting layer arranged on top of the upper electrode. Thus, light can exit from the side opposite to the glass substrate. As a consequence, the glass does not lower the light emission efficiency. Furthermore, the color-converting layer is arranged above the organic EL layer. Thus, the surface smoothness of the color-converting layer poses almost no problem. It is possible to form the color-converting layer after forming the lower electrode, the organic EL layer, and the upper electrode. Consequently, it is not necessary to give consideration to limitations due to the color-converting layer when manufacturing the upper electrode, the organic EL layer, and the lower electrode. Moreover, the light-converting layer functions as a water protection film for the organic EL layer. And since there is no need to provide a color-converting layer with large level differences below the organic EL layer, variations in the film thickness of the organic EL layer can be suppressed. Thus, light emission irregularities can be prevented.

In an organic EL device of the present invention, the lower electrode is formed directly on the substrate. Consequently, the organic EL layer can be formed on top of a flat substrate. Thus, light emission irregularities can be prevented.

In an organic EL device of the present invention, the light-converting layer covers also the side of the organic EL layer. Consequently, it prevents the intrusion of moisture from the outside into the organic EL layer.

In an organic EL device of the present invention, a plurality of lower electrodes extends in the row direction, and are lined up in the column direction, whereas a plurality of upper electrodes extend in the column direction, and are lined up in the row direction. Consequently, it is possible to cause the emission of light at desired locations.

In an organic EL device of the present invention, the lower electrodes are made up of a plurality of separate lower electrodes arranged in lines on the substrate, and switching elements controlling the voltage applied to these separate lower electrodes are arranged below each lower electrode. Consequently, it is possible to cause the emission of light at even more desired locations.

An organic EL device of the present invention has a transparent intrusion-preventing layer for preventing the intrusion of chemical compounds of the color-converting layer into the organic EL layer, arranged between the upper electrodes and the color-converting layer. Consequently, the intrusion of chemical compounds of the color-converting layer into the organic EL layer can be prevented.

Here, "substrate with a flat surface" means not only substrates with a perfectly flat surface, but also substrates with thickness variations in the order of the thickness of the organic EL layer formed on top of the substrate.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description. All changes that come within the meaning and range of equivalency of the claims are intended to be embraced therein.

What is claimed is:

1. An organic electroluminescent device, comprising:
   a substrate with a flat surface;
   a lower electrode formed in or on the flat surface of said substrate;
   an organic electroluminescent layer formed on the lower electrode so that said organic electroluminescent layer is formed on said lower electrode and said flat surface, the organic electroluminescent layer having a top surface and side surfaces;
   a transparent upper electrode formed on the organic electroluminescent layer; and
   a color-converting layer disposed on the upper electrode and the color-converting layer entirely covering the top surface and the side surfaces of the organic electroluminescent layer.

2. The organic electroluminescent device according to claim 1, further comprising a transparent intrusion-preventing layer for preventing the intrusion of chemical compounds of the color-converting layer into the organic electroluminescent layer, arranged between the upper electrode and the color-converting layer.

3. The organic electroluminescent device according to claim 2, the transparent intrusion-preventing layer being silicon oxide film.

4. The organic electroluminescent device according to claim 3, the thickness of the silicon oxide film being 150 nm.

5. The organic electroluminescent device according to claim 3, the color-converting layer being formed by screen printing manner.

* * * * *